(12) United States Patent
Zhang

(10) Patent No.: US 9,531,360 B1
(45) Date of Patent: Dec. 27, 2016

(54) HIGH SPEED COMPARATOR

(71) Applicant: Marvell International Ltd., Hamilton (BM)

(72) Inventor: Tao Zhang, Campbell, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/694,970

(22) Filed: Apr. 23, 2015

Related U.S. Application Data

(60) Provisional application No. 61/983,833, filed on Apr. 24, 2014.

(51) Int. Cl.
*H03K 5/22* (2006.01)
*H03K 5/125* (2006.01)

(52) U.S. Cl.
CPC ..................................... *H03K 5/125* (2013.01)

(58) Field of Classification Search
CPC .... H03K 5/2481; H03K 5/249; H03K 5/2418; H04L 25/0272; H03F 3/45183
USPC ....... 327/55, 65, 67, 333; 326/63, 68, 80, 81
See application file for complete search history.

(56) References Cited

U.S. PATENT DOCUMENTS

| | | | | |
|---|---|---|---|---|
| 5,659,258 | A * | 8/1997 | Tanabe et al. | 326/68 |
| 6,646,918 | B2 * | 11/2003 | Kurokawa et al. | 365/185.18 |
| 7,348,801 | B2 * | 3/2008 | Nojiri | 326/81 |
| 7,382,022 | B2 * | 6/2008 | Ajiki | 257/347 |
| 7,560,972 | B1 * | 7/2009 | Tiew et al. | 327/333 |
| 8,421,518 | B2 * | 4/2013 | Larsen | 327/333 |
| 2009/0121771 | A1 * | 5/2009 | Yen | H03K 3/356113 327/333 |

OTHER PUBLICATIONS

Sam Palermo "ECEN720: High-Speed Links Circuits and Systems", Lecture 6: RX Circuits, Analog & Mixed-Signal Center Texas A&M University Spring, 1-48 2015.

* cited by examiner

*Primary Examiner* — Quan Tra

(57) ABSTRACT

An apparatus includes an input difference determination circuit configured to determine a digital value based on a difference between first and second input signals, and a charge pump configured to provide a supply voltage to the first and second transistors to determine the digital value. The input difference determination circuit includes a first transistor and a second transistor cross-coupled to each other. A method includes generating a voltage using a charge pump, providing the voltage to an input difference determination circuit, and determining a digital value based on a difference between first and second input signals by the input difference determination circuit.

18 Claims, 4 Drawing Sheets

HIGH SPEED COMPARATOR

CROSS REFERENCE TO RELATED APPLICATION

This present disclosure claims the benefit of U.S. Provisional Application No. 61/983,833, filed on Apr. 24, 2014, which is incorporated by reference herein in its entirety.

BACKGROUND

A comparator receives first and second analog signals and produces an output signal according to respective voltage values of the first and second analog signal. The output signal has a first value, such as '0', when the voltage value of the first analog signal is less than the voltage value of the second analog signal. The output signal has a second value, such as '1', when the voltage value of the first analog signal is greater than the voltage value of the second analog signal.

The comparator may perform the comparison of the values of the first and second analog signals at a time determined according to a clock signal, thereby operating as a sampler. Such a comparator may be used, among other applications, in a Serializer/Deserializer (SERDES) receiver circuit or an Analog-to-Digital Converter (ADC) circuit. In addition, the comparator may be used in other applications where digital information needs to be recovered from analog signals, such as memory bit-line detectors and high-speed arbiters.

SUMMARY

In an embodiment, an apparatus includes an input difference determination circuit configured to determine a digital value based on a difference between first and second input signals, and a charge pump configured to provide a supply voltage to the first and second transistors to determine the digital value. The input difference determination circuit includes a first transistor and a second transistor cross-coupled to each other.

In an embodiment, an apparatus includes an input determination circuit configured to receive a first supply voltage and including first and second output nodes, a first transistor having a drain coupled to the second output node and a gate coupled to the first output node, a second transistor having a drain coupled to the first output node and a gate coupled to the second output node, and a charge pump configured to supply a second supply voltage to sources of the first and second transistors.

In an embodiment, a method includes generating a voltage using a charge pump, providing the voltage to an input difference determination circuit, and determining a digital value based on a difference between first and second input signals by the input difference determination circuit.

In an embodiment, the method further includes coupling the charge pump to a first supply voltage to store energy into the charge pump. The voltage provided to the input difference determination circuit is a second supply voltage. The input difference determination circuit includes a first transistor and a second transistor cross-coupled to each other, the first and second transistors coupled to the second supply voltage, and a third transistor and a fourth transistor cross-coupled to each other, the fourth transistor coupled to the second transistor at a first output node and the third transistor coupled to the first transistor at a second output node. A level of the second supply voltage is higher than that of the first supply voltage.

In an embodiment, the level of the second supply voltage is about twice the level of the first supply voltage.

In an embodiment, the method further includes receiving a reset signal, resetting the first and second output nodes when the reset signal has a first value, and providing the first supply voltage to the charge pump when the reset signal has the first value.

In an embodiment, the method further includes amplifying a voltage difference between a first output voltage at the first output node and a second output voltage at the second output node when the reset signal has a second value.

In an embodiment, the first and second transistors are p-channel Metal-Oxide-Semiconductor Field Effect Transistors (pMOSFETs).

In an embodiment, the method further includes receiving the first and second input signals by first and second input transistors, respectively, after coupling the charge pump to the first supply voltage. The third transistor, fourth transistor, first input transistor, and second input transistor are n-channel Metal-Oxide-Semiconductor Field Effect Transistors (nMOSFETs).

DETAILED DESCRIPTION

Figure 1A:
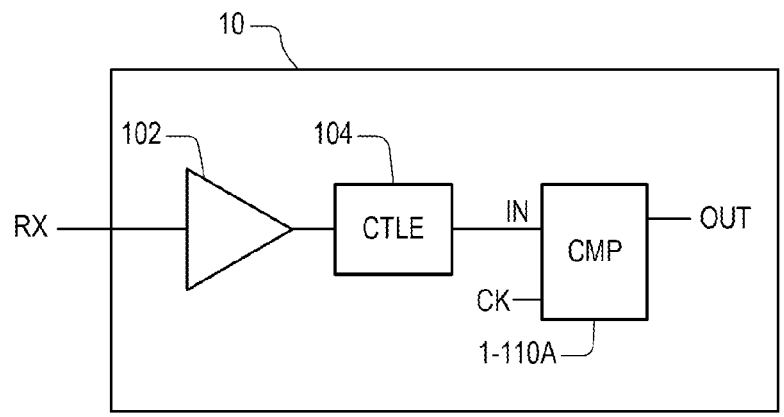
FIGS. 1A and 1B illustrate electronic devices each including a comparator according to an embodiment.
Figure 1B:
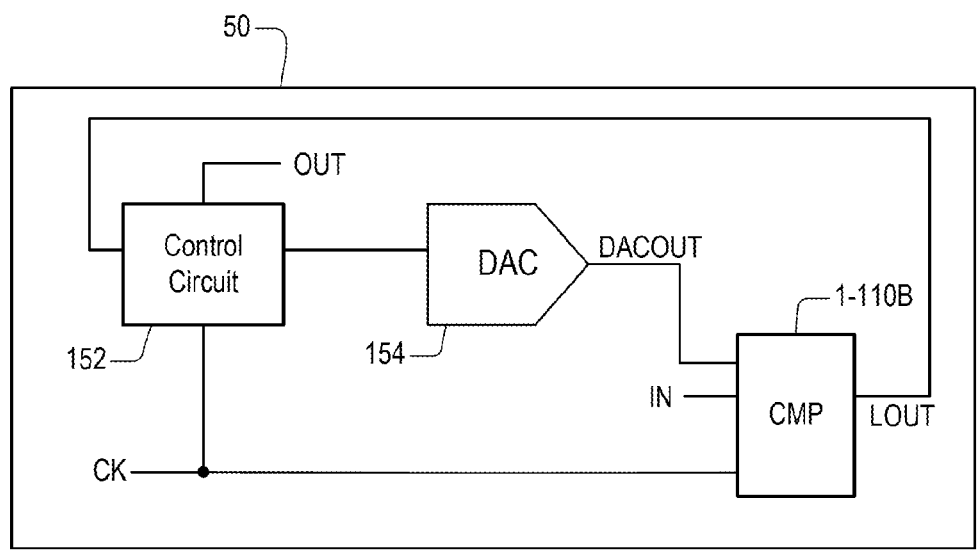

FIGS. 1A and 1B illustrate first and second electronic devices 10 and 50 according to an embodiment. Embodiments of the first and second electronic devices 10 and 50 may be provided in an integrated circuit.

The first electronic device 10 shown in FIG. 1A includes a Serializer/Deserializer (SERDES) receiver circuit including an amplifier 102, a continuous time linear equalizer (CTLE) 104, and a comparator circuit 1-110A. A person of ordinary skill in the art in light of the teachings and disclosures herein would understand that the first electronic device 10 may include other circuits known in the art, such as clock generation circuits, clock recovery circuits, power supply circuits, and the like, which are omitted in the interest of brevity.

The amplifier 102 and the CTLE 104 are configured to produce an input signal IN by amplifying and equalizing a received signal RX. In an embodiment, the received signal RX, the input signal IN, or both are differential signals. A person of skill in the art in light of the teachings and disclosures herein would understand how to implement the amplifier 102 and the CTLE 104.

The comparator circuit 1-110A is configured to produce a data out signal OUT according to a value of the input signal IN at a time according to a clock signal CK.

In an embodiment, the input signal IN is a differential signal having plus and minus signals. The comparator circuit 1-110A produces the data out signal OUT having a first value, such as a '0', when a voltage value of the plus signal of the input signal IN is less than a voltage value of the minus signal of the input signal IN. The comparator circuit 1-110A produces the data out signal OUT having a second value, such as a '1', when the voltage value of the plus input of the input signal IN is greater than the voltage value of the minus signal of the input signal IN.

In another embodiment, the comparator circuit 1-110A produces the data out signal OUT having the first value when a voltage value of the input signal IN is less than a reference voltage value. The comparator circuit 1-110A produces the data out signal OUT having the second value when the voltage value of the input signal IN is greater than the reference voltage value.

The second electronic device 50 shown in FIG. 1B includes an Analog to Digital Converter circuit (ADC) including a control circuit 152, a Digital to Analog Converter circuit (DAC) 154, and a comparator circuit 1-110B. The ADC of the second electronic device 50 may be, for example, a successive approximation ADC, a ramp-compare ADC, or a delta-encoded ADC.

The control circuit 152 and comparator circuit 1-110B receive a clock signal CK. The comparator circuit 1-110B receives an analog input signal IN at a first input.

During a first clock cycle of the clock signal CK, the control circuit 152 controls the DAC 154 to provide, to a second input of the comparator circuit 1-110B, a DAC output signal DACOUT having a first voltage value. The comparator circuit 1-110B produces a comparator output signal LOUT having a first logical value according to a comparison of the first voltage value to a voltage value of the analog input signal IN.

During a second clock cycle of the clock signal CK, the control circuit 152 controls the DAC 154 to provide the DAC output signal DACOUT having a second voltage value. The second voltage value may be less than, greater than, or equal to the first voltage value according to the first logical value of the comparator output signal LOUT and the type of the ADC converter included in the second electronic device 50. The comparator circuit 1-110B produces the comparator output signal LOUT having a second logical value according to a comparison of the second voltage value to the voltage value of the analog input signal IN.

The operations of the second clock cycle are repeated in subsequent clock cycles of the clock signal CK until the conversion is complete. When the conversion is complete, the control circuit 152 produces an output signal LOUT having the digital value.

A person of skill in the art in light of the teachings and disclosures herein would understand how to implement the control circuit 152 and the DAC 154, and that the ADC of the second electronic device 50 may include other circuits. Although the configuration of the ADC of the electronic device 50 encompasses some specific types of ADCs, embodiments are not limited thereto.

Figure 2:
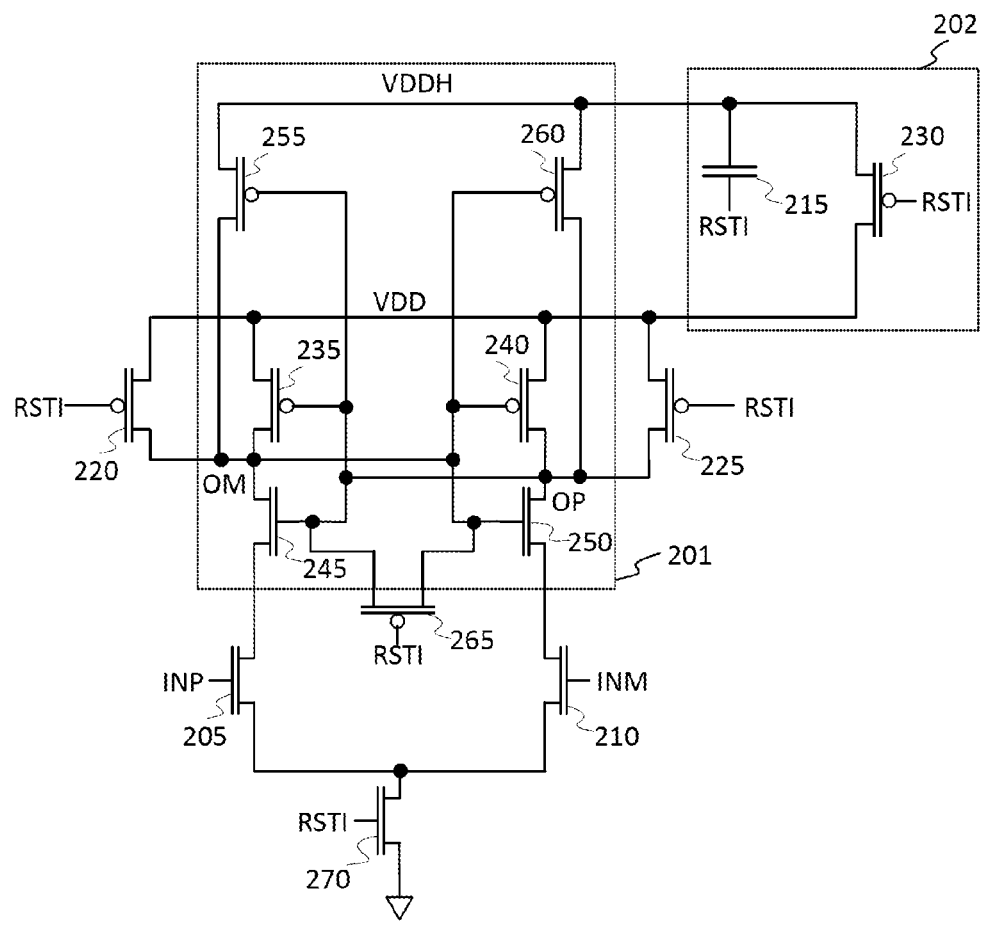
FIG. 2 is a circuit diagram of a comparator circuit suitable for use in electronic devices such as shown in FIG. 1 according to an embodiment.

FIG. 2 is a circuit diagram of a comparator 2-110 suitable for use as the comparator 1-110A of FIG. 1A or as the comparator 1-110B of FIG. 1B, according to an embodiment. The comparator 2-110 includes an input difference determination circuit 201, a charge pump circuit (or charge pump) 202, first, second, and third reset transistors 220, 225, and 265, first and second input transistors 205 and 210, and an enable transistor 270.

The input difference determination circuit 201 includes first, second, third, and fourth transistors 235, 240, 245, and 250. The input difference determination circuit 201 is coupled to a supply voltage VDD (or a first supply voltage) and drains of the first and second input transistors 205 and 210.

A source of the first transistor 235 is connected to the supply voltage VDD and a drain of the first transistor 235 is connected to a gate of the second transistor 240. A source of the second transistor 240 is connected to the supply voltage VDD and a drain of the second transistor 240 is connected to a gate of the first transistor 235. A person of skill in the art would recognize the first and second transistors 235 and 240 as being cross-coupled to each other.

The drain of the first transistor 235 is connected to a second output node (or minus output node) OM and a drain of the third transistor 245. The drain of the second transistor 240 is connected to a first output node (or plus output node) OP and a drain of the fourth transistor 250. In an embodiment, the first and second transistors 235 and 240 are p-channel Metal-Oxide-Semiconductor Field Effect Transistors (pMOSFETs).

The drain of the third transistor 245 is connected to a gate of the fourth transistor 250 and the drain of the fourth transistor 250 is connected to a gate of the third transistor 245. A person of skill in the art would recognize the third and fourth transistors 245 and 250 as being cross-coupled to each other. In an embodiment, the third and fourth transistors 245 and 250 are n-channel MOSFETs (nMOSFETs).

The input difference determination circuit 201 further includes fifth and sixth transistors 255 and 260. In an embodiment, the fifth and sixth transistors 255 and 260 are pMOSFETs. In an embodiment, the fifth and sixth transistors 255 and 260 have a size larger than that of the first and second transistors 235 and 240. For example, a width-to-length (W/L) ratio of the fifth and sixth transistors 255 and 260 is greater than that of the first and second transistors 235 and 240.

A source of the fifth transistor 255 is connected to a high supply voltage VDDH (or a second supply voltage), and a drain of the fifth transistor 255 is connected to the second output node OM. A gate of the fifth transistor 255 is connected to the gate of the first transistor 235, the gate of the third transistor 245, and the first output node OP.

A source of the sixth transistor 260 is connected to the high supply voltage VDDH, and a drain of the sixth transistor 260 is connected to the first output node OP. A gate of the sixth transistor 260 is connected to the gate of the second transistor 240, the gate of the fourth transistor 250, and the second output node OM.

Because of the larger size of the fifth and sixth transistors 255 and 260 compared to the first and second transistors 235 and 240, and because the high supply voltage VDDH has a voltage value higher than a voltage value of the supply voltage VDD when the fifth and sixth transistors 255 and 206 are operating, the fifth and sixth transistors 255 and 260 are configured to have a value of transconductance that is greater than that of the first and second transistors 235 and 240. As a result, the fifth and sixth transistors 255 and 260 are configured to supply currents to the first and second output nodes OP and OM having higher magnitudes than the currents supplied to the first and second output nodes OP and OM by the first and second transistors 235 and 240, thus accelerating the difference determination.

The charge pump circuit 202 includes a capacitor 215 and a pump transistor 230. The charge pump circuit 202 receives the inverted reset signal RSTI and provides the high supply voltage VDDH to the input difference determination circuit 201. The capacitor 215 included in the charge pump circuit 202 has a first terminal receiving the inverted reset signal RSTI and a second terminal connected to the pump transistor 230. The charge pump 202 provides the high supply voltage VDDH to the sources of the fifth transistor 255 and sixth transistor 260.

A source of the first reset transistor 220 is connected to the supply voltage VDD. A drain of the first reset transistor 220 is connected to the second output node OM.

A source of the second reset transistor 225 is connected to the supply voltage VDD. A drain of the second reset transistor 225 is connected to the first output node OP.

The third reset transistor 265 is connected between the first and second output nodes OP and OM. Gates of the first, second, and third reset transistors 220, 225, and 265 receive the inverted reset signal RSTI.

A drain of the first input transistor 205 is connected to the source of the third transistor 245 and a source of the first input transistor 205 is connected to a drain of the enable transistor 270. A gate of the first input transistor 205 receives a first input signal INP.

A drain of the second input transistor 210 is connected to the source of the fourth transistor 250 and a source of the second input transistor 210 is connected to the drain of the enable transistor 270. A gate of the first second transistor 210 receives a second input signal INM.

A source of the enable transistor 270 is connected to ground. A gate of the enable transistor 270 receives the inverted reset signal RSTI. In an embodiment, instead of receiving the inverted reset signal RSTI, the gate of the enable transistor 270 and the first terminal of the capacitor 215 may receive a sampling signal that has a high value, (e.g. a value equal to the supply voltage VDD) after the first, second and third reset transistors 220, 225, and 265 have been turned off.

Figure 3:
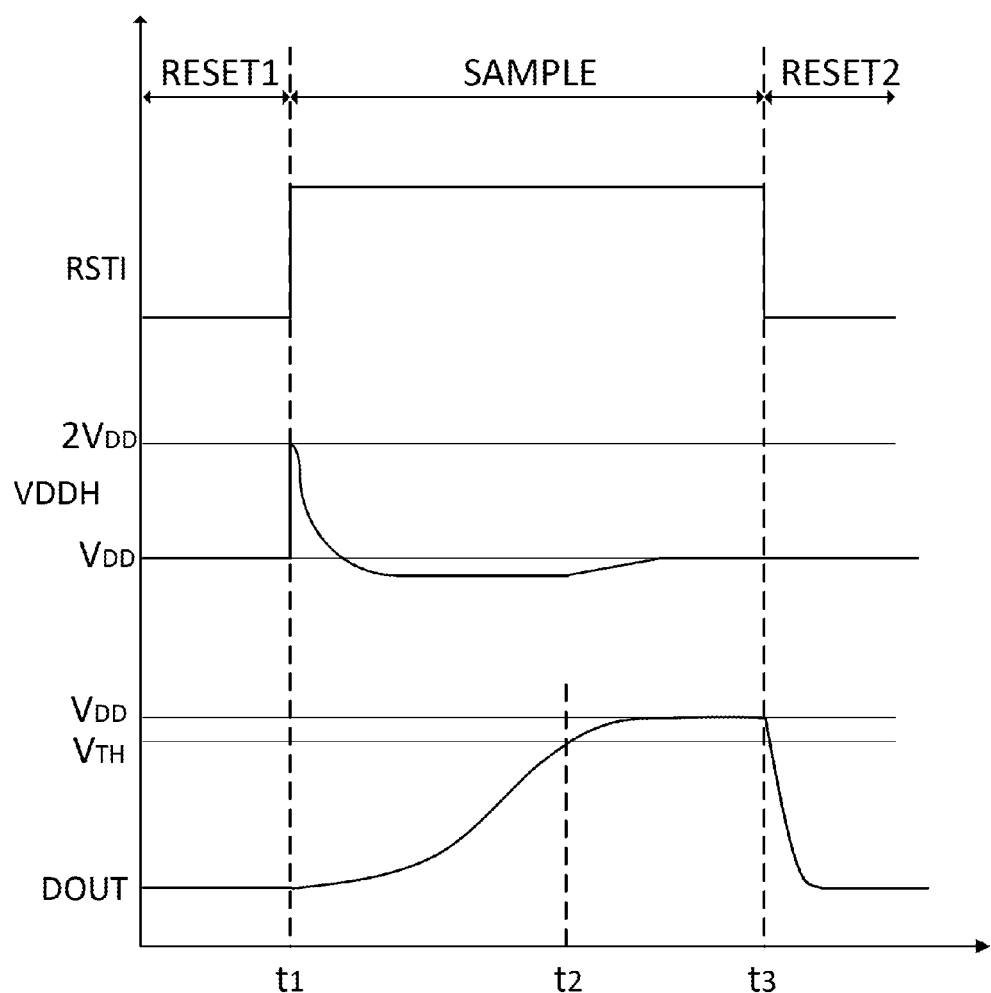
FIG. 3 illustrates waveforms related to an operation of the circuit shown in FIG. 2 according to an embodiment.

FIG. 3 illustrates waveforms related to an operation of the comparator 2-110 shown in FIG. 2 according to an embodiment. Operation of the comparator 2-110 is described below in more detail with reference to FIGS. 2 and 3.

Referring to FIG. 3, during a first reset phase RESET1, the inverted reset signal RSTI has a first value (e.g., a logic low value). The first, second, and third reset transistors 220, 225, and 265 are turned on to couple the second output node OM and the first output node OP, respectively, to the supply voltage VDD and to each other. Since the first and second reset transistors 220 and 225 pull the first and second output nodes OP and OM to the supply voltage VDD, the third and fourth transistors 245 and 250 are turned on.

In addition, the pump transistor 230 is turned on and provides the supply voltage VDD to the second terminal of the capacitor 215. In an embodiment, the second value of the inverted reset signal RSTI, which is applied to the first terminal of the capacitor 215, is substantially equal to 0 volts, and thus charges are stored in the capacitor 215 until a voltage drop across the capacitor 215 becomes substantially equal to the supply voltage VDD.

During a sampling phase SAMPLE, the inverted reset signal RSTI has a second value (e.g., a logic high value). In an embodiment, the second value of the inverted reset signal RSTI, which is applied to the first terminal of the capacitor 215, is substantially equal to the level of the supply voltage VDD. In such an embodiment, at a first time (or a start time) $t_1$ corresponding to the start of the sampling phase SAMPLE, the voltage drop across the capacitor 215 remains substantially the same level (e.g., the level of the supply voltage VDD), and thus the second terminal of the capacitor 215 has a level equal to the sum of the voltage value of the inverted reset signal RSTI and the voltage drop across the capacitor 215. As a result the level of the high supply voltage VDDH at the second terminal of the capacitor 215 becomes approximately equal to twice the level of the supply voltage VDD.

Although the charge pump circuit 202 in the embodiment shown in FIG. 2 includes the capacitor 215 that doubles the supply voltage VDD, embodiments are not limited thereto. A person of skill in the art in light of the teachings and disclosures herein would understand how to implement the charge pump 215 that generates various voltages having different levels, for example, by tripling, fractionally scaling the supply voltage VDD, or the like.

Since the sources of the fifth and sixth transistors 255 and 260 are connected to the high supply voltage VDDH, a gate-to-source voltage of the fifth and sixth transistors 255 and 260 becomes large enough to cause the fifth and sixth transistors 255 and 260 to be turned on, and a drain-to-source voltage of the fifth and sixth transistors 255 and 260 becomes large enough to cause the fifth and sixth transistors 255 and 260 to operate in a saturation mode. When currents flow through the fifth and sixth transistors 255 and 260, the charges stored in the charge pump are discharged to decrease the level of the high supply voltage VDDH to the level of the supply voltage VDD or below.

Since the inverted reset signal RSTI has the first value (e.g., a logic high value), the enable transistor 270 is turned on to connect sources of the first and second input transistors 205 and 210 to the ground. Due to a difference between the first and second input signals INP and INM applied to the gates of the first and second input transistors 205 and 210, respectively, a voltage difference DOUT between the first and second output nodes OP and OM gradually increases over time, before the fifth and sixth transistors 255 and 260 and the cross-coupled transistor pair 245 and 250 start amplifying the voltage difference DOUT. When the fifth and sixth transistors 255 and 260 and the enable transistor 270 are turned on, the fifth and sixth transistors 255 and 260 and the cross-coupled transistor pair 245 and 250 start amplifying the voltage difference DOUT via positive feedback.

As described above with reference to FIG. 2, the fifth and sixth transistors 255 and 260 are configured to have a transconductance that is greater than that of the first and second transistors 235 and 240. That is, the fifth and sixth transistors 255 and 260 have a relatively large W/L ratio and/or a drain current that has a relatively large amount flows through the fifth and sixth transistors 255 and 260 when the high supply voltage VDDH has a value greater than the supply voltage VDD. As a result, the positive feedback results in a rapid rise of the voltage difference DOUT between first and second output voltages at the first and second output nodes OP and OM.

As the voltage difference DOUT between the first and second output nodes OP and OM become larger, the first and second transistors 235 and 240 begins to provide currents in parallel to the to the fifth and sixth transistors 255 and 260. When the charge on the capacitor 215 dissipates and the high supply voltage VDDH no longer can provide current, the first and second transistors 235 and 240 take over the functions previously performed by the fifth and sixth transistors 255 and 260, respectively.

At a second time (a determination time) $t_2$, the voltage difference DOUT becomes equal to a threshold voltage VTH and a digital value corresponding to a difference between the first and second input signals INP and INM is determined. Since the positive feedback in the sampling phase SAMPLE results in a rapid rise of the voltage difference DOUT, a time interval between the start time $t_1$ of the sampling phase SAMPLE and the determination time $t_2$ to determine a digital value is reduced compared to that of a conventional sampler.

At a third time $t_3$, a second reset phase RESET2 begins to pull the first and second output nodes OP and OM to the supply voltage VDD. As a result, the voltage difference DOUT is reset to 0 volts.

Figure 4:
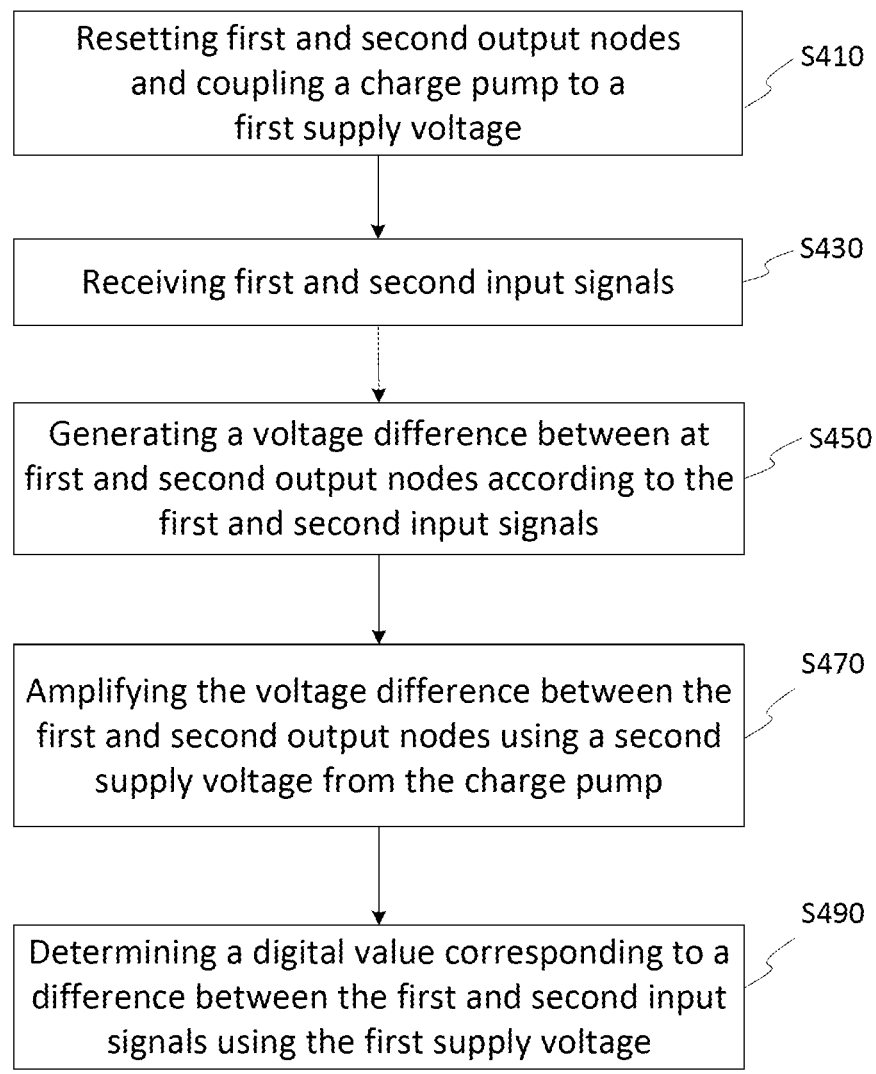
FIG. 4 is a flowchart illustrating a process for determining a digital value corresponding to a difference in input signals according to an embodiment.

FIG. 4 is a flowchart illustrating a process 400 for determining a digital value corresponding to a difference in input signals according to an embodiment. The process may be performed by a device such as the comparator 2-110 of FIG. 2. Although the flowchart shows the process being carried out in a particular order, embodiments are not limited thereto.

At S410, first and second output nodes of a circuit are reset. In an embodiment, resetting the first and second output nodes includes using a reset signal that has a first value to provide a first supply voltage to the first and second output nodes. In an embodiment, resetting the first and second output nodes includes using the reset signal to electrically connect the first output node to the second output node. In an embodiment, the first value is a low voltage value substantially equal to a ground value.

In addition, energy is stored into a charge pump. In an embodiment, the energy is stored into the charge pump by coupling the first supply voltage to a first terminal of a capacitor, while supplying a second terminal of the capacitor with a signal having a low level, thus storing charges into the capacitor until a voltage across the charge pump becomes substantially equal to the supply voltage. In an embodiment, the supply voltage is provided using the reset signal. In an embodiment, the signal supplied to the second terminal of the capacitor is the reset signal having the first value substantially equal to the ground value.

At S430, first and second input signals are received by first and second input transistors, respectively.

At S450, a voltage difference is generated between the first and second output nodes according to the first and second input signal. In an embodiment, the voltage difference is generated by enabling current flow through the first and second input transistors using the reset signal that has a second value. In an embodiment, the second value is substantially identical to the supply voltage.

At S470, the reset signal that has the second value is received at the second terminal of the capacitor of the charge pump. As a result, the charge pump provides a second supply voltage, the second supply voltage being greater than the first supply voltage. In an embodiment, the second value of the reset signal is substantially equal to the level of the supply voltage, and thus the charge pump pulls the level of the high supply voltage to approximately twice the level of the supply voltage.

The second supply voltage is supplied to an input difference determination circuit by the charge pump. First and second cross-coupled transistors connected to the second supply voltage are turned on to provide a positive feedback along with third and fourth cross-coupled transistors, and thus amplify the voltage difference between first and second output voltages at first and second output nodes, respectively. When the charges in the capacitor of the charge pump are depleted, the level of the second supply voltage becomes equal to or less that a level of the first supply voltage, the first and second cross-coupled transistors become unable provide the positive feedback, and the fifth and sixth cross-coupled transistors connected to the first supply voltage are turned on to provide the positive feedback along with the third and fourth cross-coupled transistors. In an embodiment, the first and second cross-coupled transistors have a transconductance value that is greater than a transconductance of the fifth and sixth cross-coupled transistors, and thus during the period of time when the first and second cross-coupled transistors are providing the positive feedback, the first and second cross-coupled transistors increases the voltage difference at a faster rate than the fifth and sixth cross-coupled transistors.

At S490, a digital value corresponding to a difference between the first and second input signals and is determined when the voltage difference becomes equal to a threshold voltage. Since the positive feedback provided using the first and second cross-coupled transistors after the reset signal changes to have the second value is stronger than would be the case without the first and second cross-coupled transistors and the second supply voltage, the positive feedback causes a rapid rise of the voltage difference, and the digital value can be determined within a shorter time.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus comprising:
an input difference determination circuit configured to determine a digital value based on a difference between first and second input signals, the input difference determination circuit including first, second, third, and fourth transistors, the first transistor and the second transistor cross-coupled to each other and the third and fourth transistors coupled to a first supply voltage, wherein:
a gate of the third transistor is coupled to a gate of the first transistor,
a gate of the fourth transistor is coupled to a gate of the second transistor,
a drain of the fourth transistor is coupled to a first output node, and
a drain of the third transistor is coupled to a second output node; and
a charge pump configured to provide a second supply voltage to the first and second transistors to determine the digital value; and
a reset circuit configured to receive a reset signal, to reset the first and second output nodes when the reset signal has a first value, and to provide the first supply voltage to the charge pump when the reset signal has the first value,
wherein the first and second transistors are configured to have transconductance values that are greater than those of the third and fourth transistors, respectively.

2. The apparatus of claim 1, wherein the charge pump is coupled to the first supply voltage,
wherein the input difference determination circuit further includes a fifth transistor and a sixth transistor cross-coupled to each other, the sixth transistor coupled to the second transistor at the first output node, the fifth transistor coupled to the first transistor at the second output node, and
wherein a level of the second supply voltage is higher than that of the first supply voltage.

3. The apparatus of claim 2, wherein the charge pump includes a capacitor that has first and second terminals, the apparatus further comprising:

a pump transistor configured to receive the reset signal and couple the first terminal of the capacitor to the first supply voltage when the reset signal has the first value.

4. The apparatus of claim 3, wherein the first, second, fifth, and sixth transistors are configured to amplify a voltage difference between a first output voltage at the first output node and a second output voltage at the second output node when the reset signal has a second value.

5. The apparatus of claim 2, further comprising:
a first input transistor coupled to the fifth transistor and configured to receive the first input signal; and
a second input transistor coupled to the sixth transistor and configured to receive the second input signal.

6. The apparatus of claim 5, wherein the first and second transistors are p-channel Metal-Oxide-Semiconductor Field Effect Transistors (pMOSFETs).

7. The apparatus of claim 6, wherein the fifth transistor, sixth transistor, first input transistor, and second input transistor are n-channel Metal-Oxide-Semiconductor Field Effect Transistors (nMOSFETs).

8. The apparatus of claim 7, wherein a source of the first transistor is coupled to the second supply voltage and a drain of the first transistor is coupled to the second output node,
wherein a source of the second transistor is coupled to the second supply voltage and a drain of the second transistor is coupled to the first output node,
wherein a drain of the fifth transistor is coupled to the second output node and a source of the fifth transistor is coupled to a drain of the first input transistor, and
wherein a drain of the sixth transistor is coupled to the first output node and a source of the sixth transistor is coupled to a drain of the second input transistor.

9. An apparatus comprising:
an input determination circuit configured to receive first and second supply voltages and including first and second output nodes, the input determination circuit including;
a first transistor having a drain coupled to the second output node, a source coupled to the second supply voltage, and a gate coupled to the first output node;
a second transistor having a drain coupled to the first output node, a source coupled to the second supply voltage, and a gate coupled to the second output node;
a third transistor having a gate coupled to the gate of the first transistor, a source coupled to the first supply voltage, and a drain coupled to the first output node; and
a fourth transistor having a gate coupled to the second transistor, a source coupled to the first supply voltage, and a drain coupled to the second output node;
a charge pump configured to supply the second supply voltage; and
a reset circuit configured to receive a reset signal, to reset the first and second output nodes when the reset signal has a first value, and to provide the first supply voltage to the charge pump when the reset signal has the first value,
wherein the first and second transistors are configured to have transconductance values that are greater than those of the third and fourth transistors, respectively.

10. The apparatus of claim 9, wherein a level of the second supply voltage is higher than a level of the first supply voltage.

11. The apparatus of claim 9, wherein the charge pump is configured to supply the second supply voltage using energy from the first supply voltage.

12. The apparatus of claim 9, wherein the charge pump receives the reset signal, and
wherein the charge pump provides the second supply voltage having a first level equal to a level of the first supply voltage when the reset signal has the first value, and provides the second supply voltage having a second level higher than the level of the first supply voltage when the reset signal has a second value.

13. A method comprising:
determining a digital value based on a difference between first and second input signals by an input difference determination circuit, the input difference determination circuit including first, second, third, and fourth transistors, the first transistor and the second transistor being cross-coupled to each other, the third and fourth transistors being coupled to a first supply voltage, a gate of the third transistor being coupled to a gate of the first transistor, and a gate of the fourth transistor being coupled to a gate of the second transistor, the first and second transistors having transconductance values that are greater than those of the third and fourth transistors, respectively;
generating a second supply voltage using a charge pump;
providing the second supply voltage to the input difference determination circuit;
coupling the charge pump to the first supply voltage to store energy into the charge pump, wherein the first and second transistors are coupled to the second supply voltage, wherein the input difference determination further includes a fifth transistor and a sixth transistor cross-coupled to each other, the sixth transistor coupled to the second transistor at a first output node and the fifth transistor coupled to the first transistor at a second output node, and wherein a level of the second supply voltage is higher than that of the first supply voltage;
receiving a reset signal;
resetting the first and second output nodes when the reset signal has a first value; and
providing the first supply voltage to the charge pump when the reset signal has the first value.

14. The method of claim 13, wherein the level of the second supply voltage is about twice the level of the first supply voltage.

15. The method of claim 13, further comprising: amplifying a voltage difference between a first output voltage at the first output node and a second output voltage at the second output node when the reset signal has a second value.

16. The method of claim 15, wherein the first and second transistors are p-channel Metal-Oxide-Semiconductor Field Effect Transistors (pMOSFETs).

17. The method of claim 16, further comprising:
receiving the first and second input signals by first and second input transistors, respectively, after coupling the charge pump to the first supply voltage,
wherein the fifth transistor, sixth transistor, first input transistor, and second input transistor are n-channel Metal-Oxide-Semiconductor Field Effect Transistors (nMOSFETs).

18. The apparatus of claim 3, wherein the reset circuit includes first and second transistors, the first reset transistor being coupled to the first supply voltage and the first output node, the second reset transistor being coupled to the first supply voltage and the second output node.

* * * * *